United States Patent
Kano

(10) Patent No.: US 8,878,089 B2
(45) Date of Patent: Nov. 4, 2014

(54) TWIST MOUNT ROTARY SELECTOR SWITCH

(71) Applicant: Sigmatron International, Inc., Elk Grove Village, IL (US)

(72) Inventor: Yoshio W. Kano, Barrington, IL (US)

(73) Assignee: Sigmatron International, Inc., Elko Grove Village, IL (US)

( * ) Notice: Subject to any disclaimer, the term of this patent is extended or adjusted under 35 U.S.C. 154(b) by 252 days.

(21) Appl. No.: 13/654,618

(22) Filed: Oct. 18, 2012

(65) Prior Publication Data

US 2014/0110238 A1   Apr. 24, 2014

(51) Int. Cl.
*H01H 13/68* (2006.01)

(52) U.S. Cl.
USPC ........ 200/518; 200/564; 200/179; 200/11 TC

(58) Field of Classification Search
USPC ......... 200/518, 564, 565, 569, 570, 571, 572, 200/252, 179, 11 TC
See application file for complete search history.

(56) References Cited

U.S. PATENT DOCUMENTS

| | | | |
|---|---|---|---|
| 4,082,925 A * | 4/1978 | Hufford | 200/11 G |
| 4,390,757 A * | 6/1983 | Wiessner | 200/11 G |
| 6,262,378 B1 * | 7/2001 | Chou | 200/4 |
| 6,384,357 B1 * | 5/2002 | Morrison | 200/520 |
| 6,906,270 B2 * | 6/2005 | Roth et al. | 200/5 R |
| 6,972,386 B1 * | 12/2005 | McSwiggen | 200/11 R |
| 7,105,755 B2 * | 9/2006 | Imamura | 200/11 DA |
| 7,211,755 B1 * | 5/2007 | Wang et al | 200/336 |

* cited by examiner

*Primary Examiner* — Kyung Lee
(74) *Attorney, Agent, or Firm* — Steven Behnken

(57) ABSTRACT

A switch includes a printed circuit board and a contact piece with first and second contacts. The printed circuit board has a power input contact, a power output contact, a noncontact area, and a plurality of signal contacts that are disposed at a plurality of predetermined positions. The power input contact and the plurality of signal contacts are disposed on the printed circuit board such that, upon movement of the first contact from the noncontact area to a signal contact, the second contact will align with the power input contact prior to the first contact aligning with the signal contact.

26 Claims, 7 Drawing Sheets

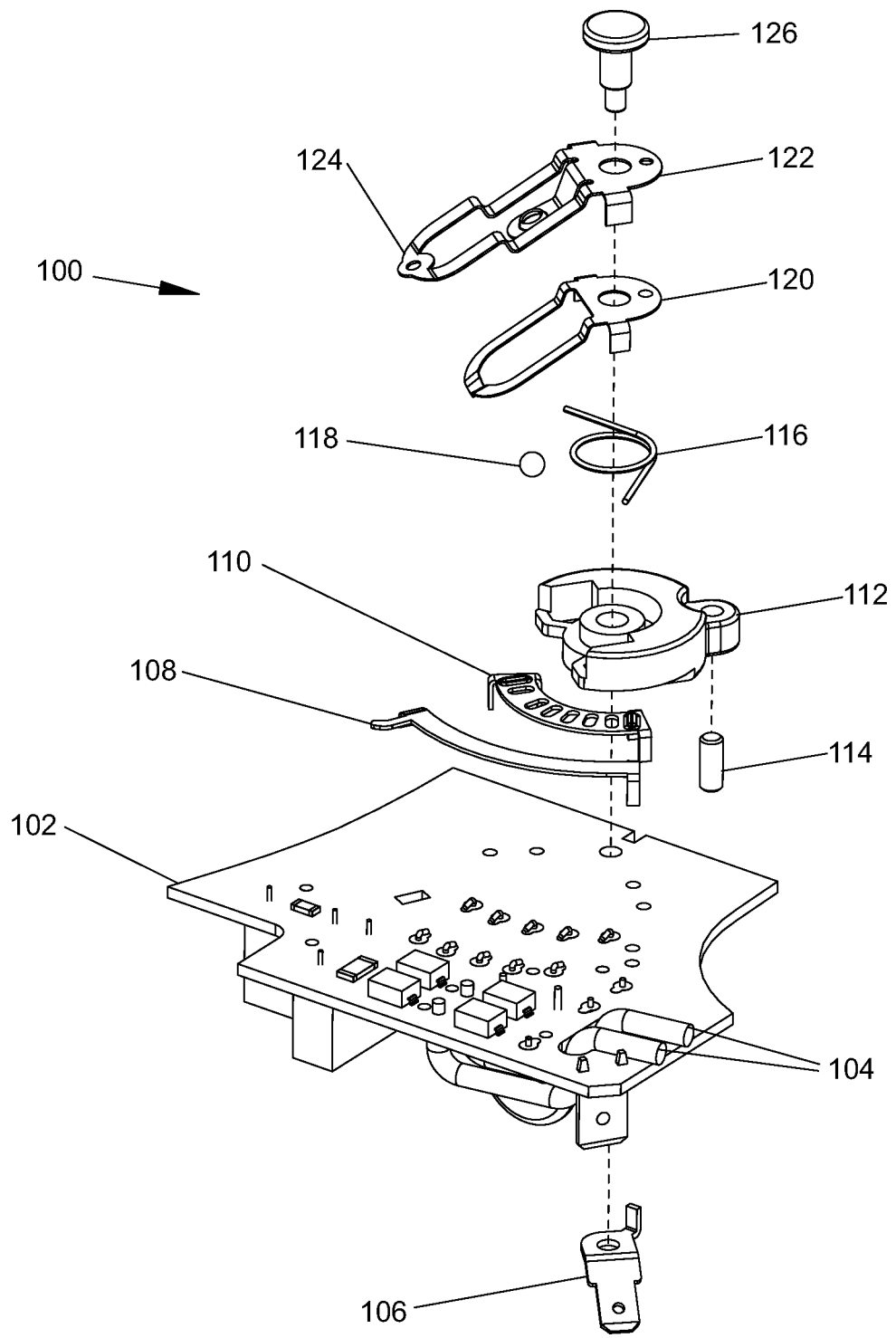
Fig. 1 - Prior Art

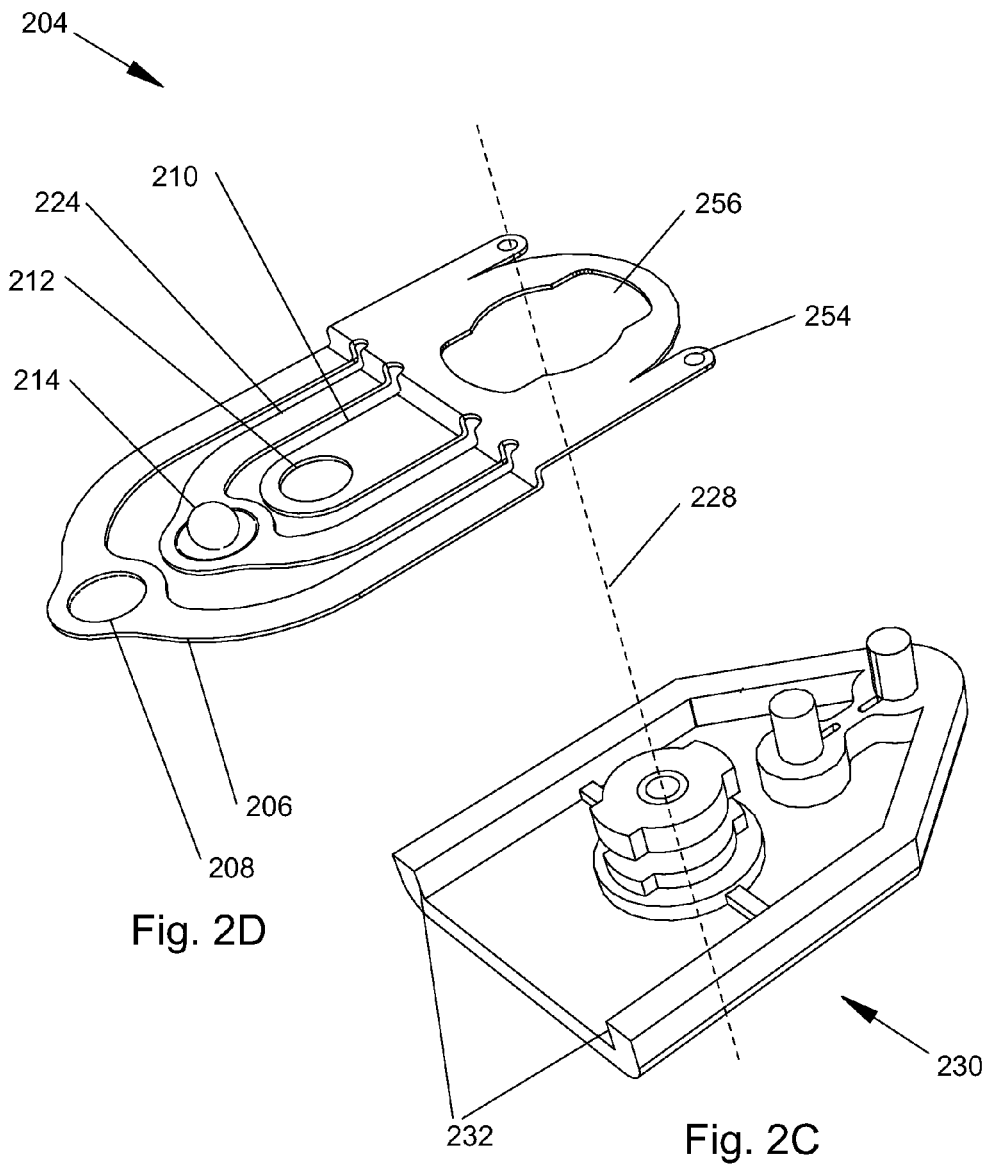

TWIST MOUNT ROTARY SELECTOR SWITCH

TECHNICAL FIELD

Multi-position switches are used in a variety of electronic devices. Frequently, they not only turn on the electronic device, but they also are used to control the settings, e.g. speed at which the device operates, of the device. FIG. 1 is an exploded view of one prior art switch, indicated generally at 100.

BACKGROUND OF THE INVENTION

Multi-position switches are used in a variety of electronic devices. Frequently, they not only turn on the electronic device, but they also are used to control the settings, e.g. speed at which the device operates, of the device. FIG. 1 is an exploded view of one prior art switch, indicated generally at 100.

The switch 100 has a printed circuit board 102 which is connected to wires 104 that supply the switch 100 with power. The switch 100 has a number of contact pieces 120, 122 that are affixed to the switch and have contacts (not shown) that make contact with a metal conducting strip 108 and/or a detent strip 110 that have been affixed to the printed circuit board 102. The contact pieces 120, 122 are usually moved from one position to another using a plastic hub 112 that rivets 126 it to the printed circuit board 102. A male tab 106 is used to provide an electrical connection to the rivet 126 and the contact pieces 120, 122 and completes the circuit while the switch 100 is in use. A stop pin 114 may be used in conjunction with the hub 112 to limit its rotation.

A ball bearing 118 or other such positioner often cooperates with the detent strip 110 to position the contact pieces 120, 122 in the proper position and provides the "click" that the user feels when moving from one position to another. A spring 116 can be integrated into the hub 112 to provide resistance or to bias the contact pieces 120, 122 to a particular position.

The switch 100 described above and shown FIG. 1 has a minimum of eleven separate parts, which must be fabricated and assembled, which significantly increases the cost of the switch 100. It would be advantageous to provide the same functionality, while reducing the number of parts and increasing the speed of assembly.

SUMMARY OF THE INVENTION

The switch described below provides a reliable alternative to prior art switches. One of the primary benefits of the claimed switch is that it has a reduced number of parts, which lowers the overall cost of the switch and increases the speed of its assembly. Additionally, the switch also utilizes a staged, or tiered, method of energizing, which allows the power to be supplied to the contact piece and to reach steady-state before the signal contact and the associated electronics are powered up.

According to one aspect of the invention, a switch includes a contact piece having a first arm with a first contact and a second arm with a second contact. The first arm and the second arm are integrally formed with one another, and the rotary switch also comprises a positioner and a printed circuit board. The printed circuit board has top surface, a power input contact formed as part of the top surface, a plurality of signal contacts disposed at a plurality of predetermined positions as part of the top surface, and a plurality of detents that are integrally formed into the top surface of the printed circuit board. At least one detent is operable with the positioner to station the first contact of the first arm on a signal contact. The first contact of the contact piece is operable to make an electrical connection with one of the plurality of signal contacts and the second contact is operable to make an electrical connection with the power input contact.

In a second embodiment, a switch comprises a contact piece and a printed circuit board. The contact piece has a first contact and a second contact. The printed circuit board has top surface, a power input contact formed as part of the top surface, a power output contact formed as part of the top surface, a noncontact area of the top surface, and a plurality of signal contacts disposed at a plurality of predetermined positions as part of the top surface. The power input contact and the plurality of signal contacts are disposed on the top surface of the printed circuit board such that, upon movement of the first contact from the noncontact area to a signal contact, the second contact will align with the power input contact prior to the first contact aligning with the signal contact.

In another embodiment, a method of assembling a selector switch comprises providing a printed circuit board having a bottom surface, a top surface, and a mounting hole that extends through the printed circuit board. A contact piece is provided, where the contact piece has post hole formed therein, a first arm having a first contact, and a second arm having a second contact. The first and second arms are integrally formed with one another.

A hub is provided, where the hub has at least one engaging surface for engaging with the contact piece and a mounting post having an outer surface, an oblong bottom end, and at least one protrusion extending radially outwardly from the outer surface of the mounting post. The at least one protrusion has a retainer surface for engaging with the bottom surface of the printed circuit board.

The contact piece is oriented relative to the hub such that the at least one engaging surface of the hub will engage the contact piece when the switch is assembled, and the oblong bottom end of the mounting post is inserted through the post hole of the contact piece. The printed circuit board is oriented such that the oblong bottom end will pass through the mounting hole, and the oblong bottom end of the mounting post is inserted through the mounting hole. The hub and contact piece are rotated such that the retainer surface of the at least one protrusion engages with the bottom surface of the printed circuit board.

In another embodiment, a method of manufacturing a switch comprises providing a printed circuit board having a top surface and a noncontact area. At least one signal contact is formed as part of the top surface of the printed circuit board along a path of travel over the top surface, and a power input contact is formed as part of the top surface of the printed circuit board along the path of travel.

A first contact is provided and is operable to make a first electrical connection with the at least one signal contact. A second contact is provided and is operable to make a second electrical connection with the power input contact. The power input contact is offset from the signal contact along the path of travel such that, upon simultaneously moving the first and second contacts along the path of travel from the noncontact area toward the at least one signal contact, the second contact makes the second electrical connection with the power input contact before the first contact makes the first electrical connection with the at least one signal contact.

A rotary switch includes a contact piece that is integrally formed from a conductive material and has a pivot point. The integrally formed contact piece has a first arm having a first contact, a second arm having a second contact, and a third arm with a first portion of a positioning mechanism. The second contact is electrically connected to the first contact. The rotary switch also includes a printed circuit board having a top surface, a power input contact formed into the top surface, a noncontact area disposed on the top surface, electrically isolated signal contacts formed into the top surface, and a second portion of the positioning mechanism, the second portion defined by the top surface. The second portion is mateable with the first portion of the positioning mechanism.

The integrally formed contact piece is rotatable about the pivot point to be parallel to the printed circuit board between a first position and a second position, and the integrally formed contact piece biases the first contact and the second contact to the top surface the printed circuit board.

When the integrally formed contact piece is in the first position, the first and second portions of the positioning mechanism are disposed to maintain the integrally formed contact piece in the first position, such that the second contact is electrically isolated from the power input contact and the first contact is electrically isolated from the signal contacts. When the integrally formed contact piece is in the second position, the first and second portions of the positioning mechanism are disposed to maintain the integrally formed contact piece in the second position, such that the second contact is electrically connected to the power input contact and the first contact is electrically connected to a signal contact.

BRIEF DESCRIPTION OF THE DRAWINGS

Further aspects of the invention and their advantages can be discerned in the following detailed description, in which like characters denote like parts and in which:

FIG. 1 is an exploded view of a selector switch according to the prior art;

FIG. 2C is an isometric view of a hub having engaging surfaces, a mounting post, an oblong bottom end, and stop pins;

FIG. 2D is an isometric view of a contact piece having a first contact on a first arm, a second contact on a second arm, and a third arm.

FIG. 2E is a side view of the hub showing a stop pin, a pin hole, and the outer surface and oblong bottom end of the mounting post;

DETAILED DESCRIPTION OF PRESENTLY PREFERRED EMBODIMENTS

Figure 2A:
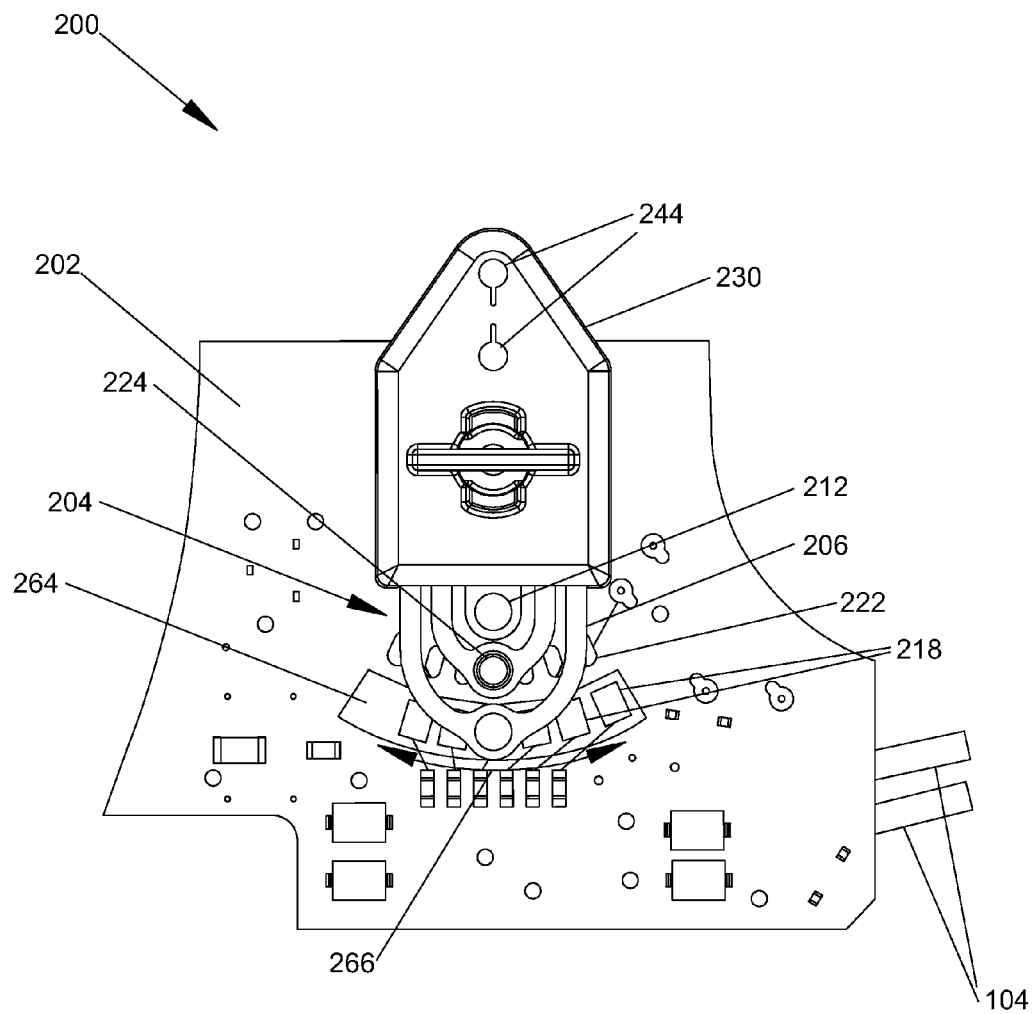
FIG. 2A is plan view of a selector switch according to a first embodiment.

Referring to FIGS. 2A-2F, a rotary switch, indicated generally at 200 of FIG. 2A, has a contact piece 204, a printed circuit board 202, and a positioner 214 that acts as a portion of a positioning mechanism that keeps the contact piece 204 in the desired position. The contact piece 204 is made of a conductive material and has a first arm 206 with a first contact 208 and a second arm 210 with a second contact 212. The contact piece 204 can be biased to keep the first and second contacts 208, 212 to the top surface 260 of the printed circuit board 202 as by forming arches into the contact piece 204. As shown in FIG. 2D, the first and second arms 206, 210 may be integrally formed with one another. As used herein, "integrally formed" is defined as being fabricated from a single piece or multiple pieces that have been permanently bonded to one another.

Figure 2B:
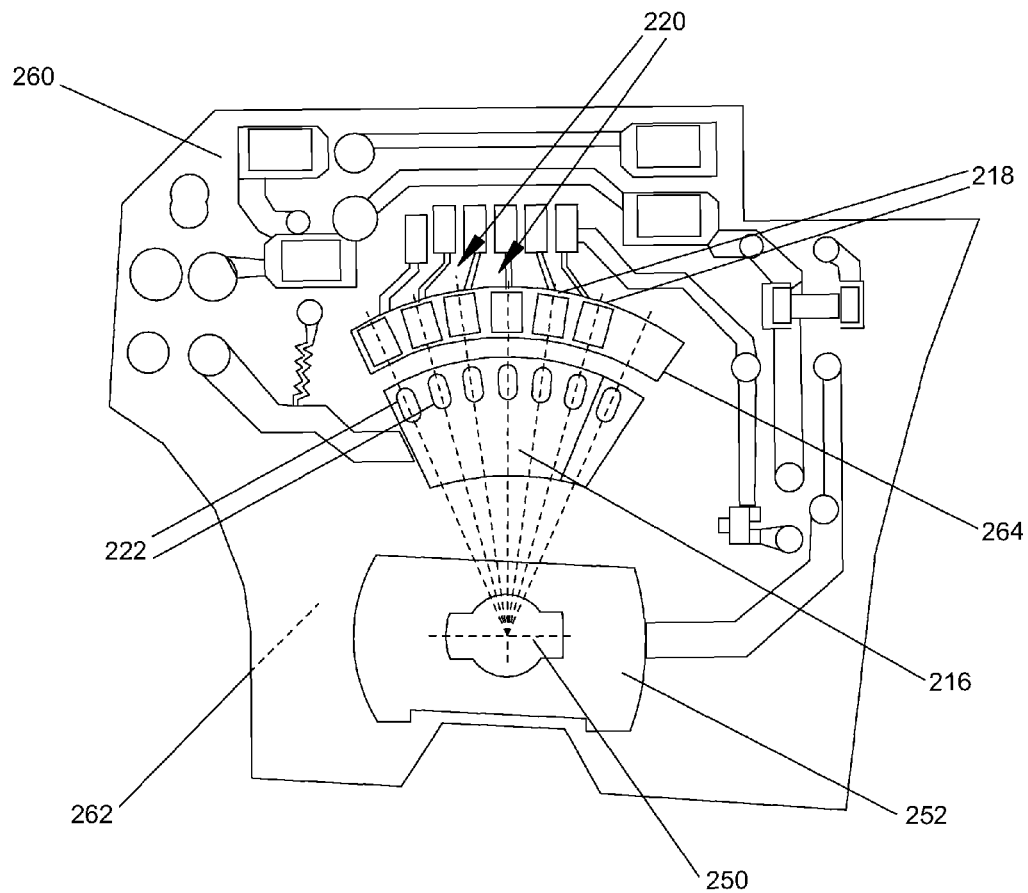
FIG. 2B is a plan view of a printed circuit board having a mounting hole, a plurality of signal contacts, a power input contact, and a power output contact.

As best seen in FIG. 2B, the printed circuit board 202 has a power input contact 216, a plurality of signal contacts 218 disposed at a plurality of predetermined positions 220 on the printed circuit board 202. In one embodiment, the power input contact 216 is formed into the top surface 260 of the printed circuit board 202 rather than being a separate piece that is attached to the printed circuit board 202. Extensive testing on the power input contact 216, the power output contact 252 (described below), and the signal contacts 218, has determined that contacts that are integrally formed with the printed circuit board can provide the required current loading capacity and durability for the switch. This has the advantage of reducing both the number of parts in the switch and the number of assembly steps.

Each of the signal contacts 218 are electrically isolated from one another and are also formed into the top surface 260 of the printed circuit board 202 through processes such as etching to expose conductive materials and/or deposition of a conductive material onto the printed circuit board 202.

The printed circuit board 202 also has a plurality of detents 222 that are integrally formed into the printed circuit board 202 that act as a second portion of the positioning mechanism to keep the contact piece 204 in the desired position. The one or more detents 222 are operable in coordination with the positioner 214 to station the first contact 208 of the first arm 206 on a signal contact 218.

It is contemplated that the positioning mechanism is not limited to detents 222 being formed into the top surface 260 of the printed circuit board 202. Instead, the positioner 214 may have a detent (not shown) formed into a third arm 224 and printed circuit board 202 may have one or more protrusions (not shown) formed as part of the top surface 260 such that the protrusions and detent cooperate to station the contact piece 204 in the desired position.

Additionally, FIG. 2B shows the signal contacts 218 being disposed in arcuate pattern outside of the detents 222 and shows the detents 222 being outside of the power input contact 216. This is only one possible configuration and the claims are not intended to be limited to this particular configuration. For example, the signal contacts 218 and the detents 222 could be arranged in a straight line, or the signal contacts 218 may be disposed inside of the detents 222.

FIGS. 2A and 2B show that printed circuit board 202 also has a noncontact area 264 and that one of the detents 222 is operable with the positioner 214 to station the first contact 208 of the first arm 206 on the noncontact area 264 of the printed circuit board 202. FIG. 2B shows the noncontact area 264 as being a small defined area adjacent to the signal contact 218, detents 222, and power input contact 216. The embodiment shown in FIG. 2B is only illustrative and is not intended to be limiting, as the noncontact area 264 can be any portion of the printed circuit board 202 that is not electrically active and can even encompass the entire area of the printed circuit board 202 that is not used as a contact.

In one embodiment, the contact piece 204 also has a third arm 224 (see FIG. 2D) that is integrally formed with the first arm 206 and the second arm 210 and the positioner 214 is disposed to be on the third arm 224. The positioner 214 may take a variety of forms, e.g. an indentation in the third arm 224 in the same manner that the contact 208 is formed into the first arm 206. Alternatively, the positioner 214 can take the form of a ball bearing (see FIGS. 2D and 2F) disposed to couple with the third arm 224. While FIG. 2D shows the third arm 224 positioned between the first and third arms 206, 210 of the contact piece 204, it may be disposed in a position that is opposite the first and second arms 206, 210, orthogonal to them, or at a variety of other angles. Further, it is important to note that the positioner 214 need not necessarily even be integrated into the third arm 224 or into the contact piece 224.

The switch 200 may also comprise a hub 230, which can be made from a nonconducting material, thus insulating the contact piece 204 from the user operating the switch, and may take a variety of forms. In one embodiment, FIG. 2C shows the hub 230 has engaging surfaces 232 that engage the contact piece 204 and are operable to move the first contact 208 of the first arm 206 between the plurality of positions 220. In this example, the shape of the mounting post 233 (being generally circular with two projecting lobes) is also complementary to the shape of the hole 256 formed in the contact piece 204, to further assist rotation of the contact piece 204 when turning the hub 230. Those skilled in the art will appreciate that the shape of the hole 256 can be any eccentric shape which allows the hub 230 to rotate the contact piece 204 about the axis of the hub 230.

Figure 2F:
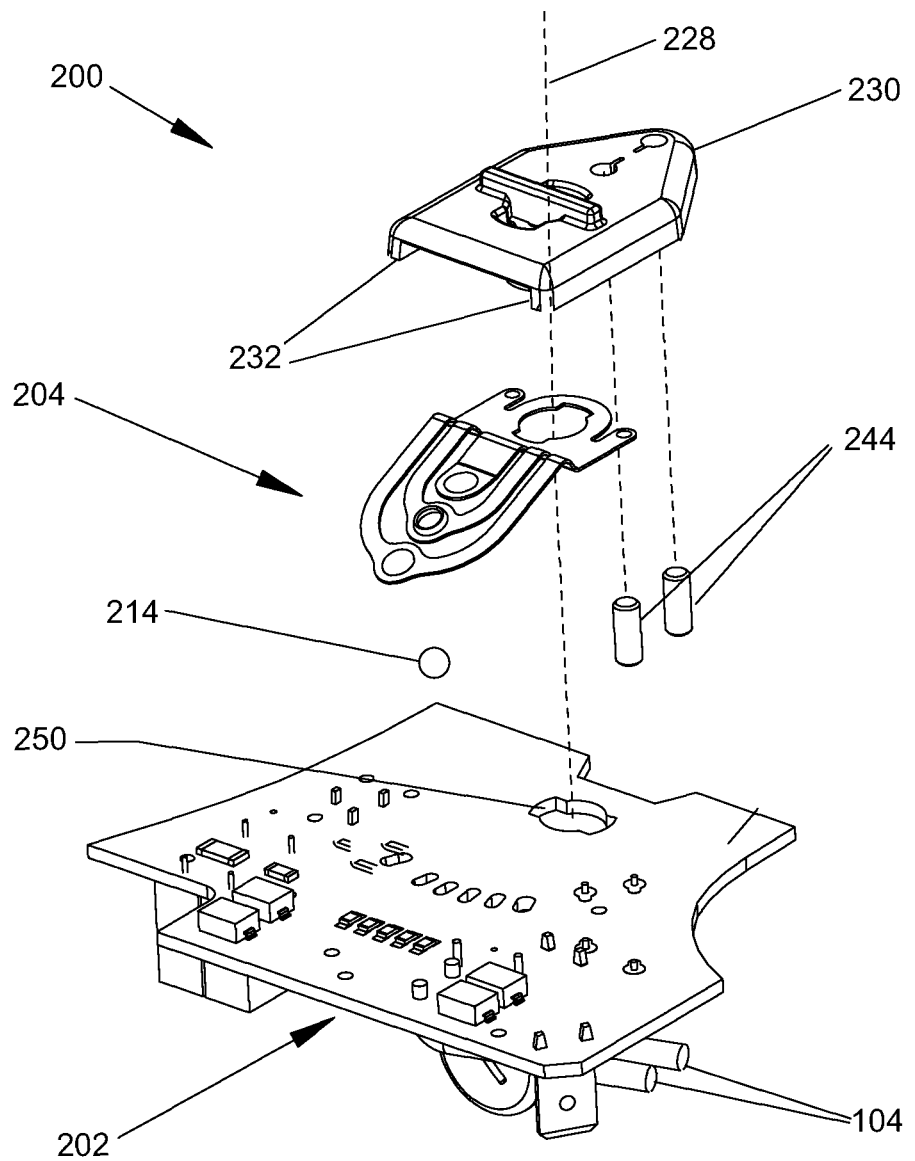
FIG. 2F is an exploded view of a selector switch according to the embodiment shown in FIG. 2A.

The shape of the mounting post 233 can be selected to expedite operation and assembly of the rotary switch. In this example, the mounting post 233 has an upper portion away from the body of the hub 230 and a lower portion near the body of the hub 230, both having the same shape and being fixed parallel to each other. The upper portion and the lower portion of the mounting post 233 are joined by a circular central portion having the same diameter as the circular portions of the upper portion and a lower portion of the mounting post 233. The upper portion and the lower portion also include one or more lobes to lock the hub 230 to the printed circuit board 202. The hole 256 formed in the contact piece 204 has a periphery complementary to the shape of the mounting post 233, so that the contact piece 204 can be slid over the upper portion and the lower portion without rotation. When the contact piece 204 is seated in the hub 230, the hole 256 is engaged about the lower portion of the mounting post 233. The printed circuit board 202 can define a mounting hole 250 through the printed circuit board 202 operable to receive the mounting post 233. In the example of FIG. 2F, the shape of the mounting hole 250 is the same as the shape of the mounting post 233, but rotated 90 degrees from the final orientation of the mounting post 233 when the switch is finally assembled. During assembly, the upper portion of the mounting post 233 passes through the mounting hole 250 and the hub 230 is rotated 90 degrees to lock the hub 230 with the contact piece 204 to the printed circuit board 202. A stop pin 244 can then be placed through the hub 230 to engage a hole or cut out in the printed circuit board 202 to prevent over rotation of the hub 230 and realignment of the upper portion of the mounting post 233 with the mounting hole 250. In this manner, the printed circuit board 202 is engaged between the upper portion and the lower portion of the mounting post 233 so that the hub 230 is free to rotate but the hub 230 is also locked to the printed circuit board 202.

In one embodiment, the printed circuit board 202 has a mounting hole 250 (see FIGS. 2B and 2F) through the circuit board 202 and a power output contact 252 that is disposed around at least a portion of the mounting hole 250. The hub 230 has a mounting post 233 (see FIGS. 2C, 2E, and 2F) that is insertable into the mounting hole 250 in the printed circuit board 202 such that the hub 230 is rotatable around an axis 228 formed by the mounting post 233. The contact piece 204 also includes a third contact 254 (FIG. 2D) that is disposed to engage the power output contact 252 (FIG. 2B). Again, it is important to note that this is only one exemplary configuration. A variety of configurations for the power input contact 216 and power output contact 252, including the reverse of the one just described and illustrated, may be used.

In another embodiment, the power input contact 216 is positioned on the printed circuit board 202 such that, upon movement of the first contact 208 along a path of travel 266 (see FIG. 2A) from a first position, e.g., the noncontact area 264 to a second position, e.g., a signal contact 218, the second contact 212 will align with the power input contact 216. The term "align" as used herein, means that a contact or contacts 206, 212, 254 make physical contact with the input, output, or signal contacts 216, 252, 218 such that an electrical connection is formed and current can flow.

As the second contact 212 aligns with the power input contact 216, it forms an electrical connection prior to the first contact 208 aligning with the signal contact 218. This completes an electrical circuit from the power input contact 216 through the contact piece 204 and the power output contact 252 and energizes the contact piece 204, allowing it to come to steady-state, before the first contact 208 aligns with the signal contact 218. The first contact 208, which is now energized with a voltage and is at steady state, subsequently aligns with the signal contact 218 and completes a circuit that includes the power input contact 216, the contact piece 204, the first contact 208, and the signal contact 218.

This stepped, or tiered, power-up configuration can be accomplished a variety of different ways. However, one way to accomplish this is to design the power input contact 216 and the signal contacts 218 in an offset manner, such that as the first contact 208 and the second contact 212 are moved from the noncontact area 264 (the "off" position) along the path of travel 266 to a signal contact 218, the second contact 212 makes contact with the power input contact 216 while the first contact 208 has not yet contacted the signal contact 218.

This reduces the chances of a power surge through the signal contacts 218 which would potentially damage the printed circuit board 202. This also has the advantage that the power input contact 216 is not electrically active, that is, no power can flow through the power input contact, if the first contact 208 is aligned with the noncontact area 264 of the printed circuit board 202.

As shown in FIGS. 2B, 2C, 2E, and 2F, the printed circuit board 202 and the hub 230 have a unique configuration allows for quick and reliable assembly. Specifically, the mounting hole 250 of the printed circuit board 202 is oblong, and the printed circuit board 202 and the mounting post 233 of the hub 230 mate together in a twist-lock configuration.

Referring to FIGS. 2C and 2E, the mounting post 233 has an outer surface 234, an oblong bottom end 236, and one or more protrusions 238 that extends radially outwardly from the outer surface 234 of the mounting post 233. The protrusion 238 forms a portion of the oblong bottom end 236 and the one or more protrusions 238 have a retainer surface 240 that engages with the bottom surface 262 of the printed circuit board 202. This configuration allows for the quick assembly of the switch 200 without the need for additional tools and steps such as riveting the contact 204 to the printed circuit board 202.

The hub 230 can define a stop pinhole 242 (see FIG. 2E) that is disposed through the hub 230 and the switch includes a stop pin 244 that is disposed in the stop pinhole 242. The stop pin 244 is slidable within the stop pin hole 242 and engages a portion of the printed circuit board 202 to prevent over-rotation of the hub 230.

Figure 3:
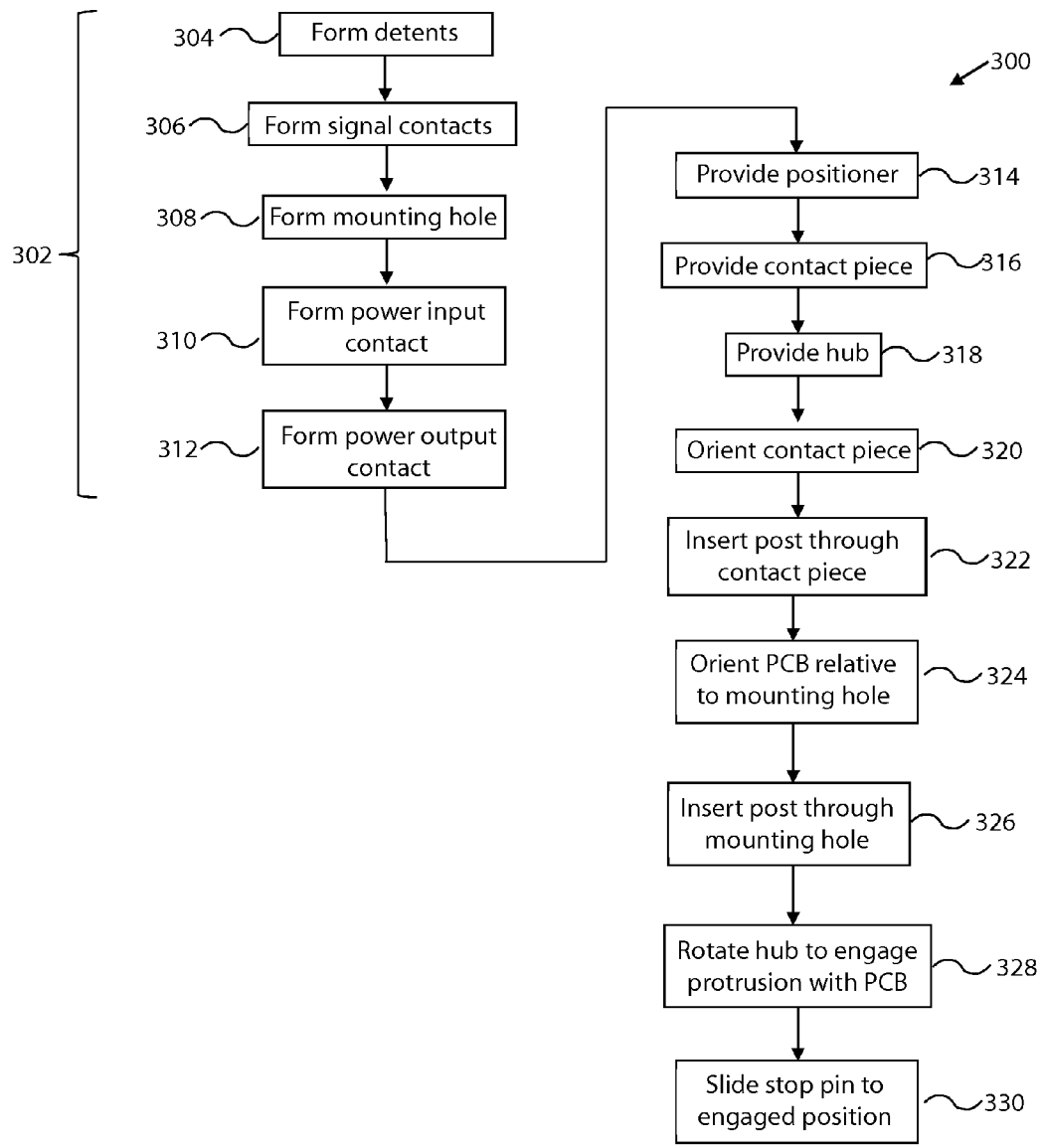
FIG. 3 is flow chart showing a method of assembling the selector switch according to the embodiment shown in FIG. 2A.

FIG. 3 is a flow chart showing a method of assembling the selector switch according to the embodiment shown in FIG. 2A. The method, indicated generally at 300 of FIG. 3, of assembling a selector switch comprises providing 302 a printed circuit board 202, providing 314 a positioner, providing 316 a contact piece, and providing 318 a hub. As above, the printed circuit board has a bottom surface, a top surface, and a mounting hole that extends through the printed circuit board. The contact piece has a post hole, a first arm having a first contact, and a second arm having a second contact. The first and second arms are integrally formed with one another. The hub has one or more engaging surfaces for engaging with the contact piece and a mounting post with an outer surface and oblong bottom end. At least one protrusion extends radially outwardly from the outer surface of the mounting post, and the one or more protrusions have a retainer surface for engaging with the bottom surface of the printed circuit board.

The contact piece is oriented 320 relative to the hub such that, when the switch is assembled, the one or more engaging surfaces of the hub will engage the contact piece. The oblong bottom end of the mounting post may then be inserted 322 through the post hole of the contact piece. The printed circuit board can then be oriented 324 such that the oblong bottom end will pass through the mounting hole. The oblong bottom end may then be inserted 326 through the mounting hole, and the hub and the contact piece are rotated 328 such that the retainer surface of the one or more protrusions engages with the bottom surface of the printed circuit board.

Providing 302 the printed circuit board may comprise several substeps that are performed prior to assembly or during assembly. Specifically, a plurality of detents may be formed 304 into the top surface of the printed circuit board. The plurality of signal contacts may be formed 306 as part of the top surface of the printed circuit board at the first plurality of predetermined positions. The mounting hole may be formed 308 into the printed circuit board, the power input contact may be formed 310 as part of the printed circuit board, and the power output contact may be formed 312 as part of the printed circuit board.

Once the hub in contact piece have been rotated 328 such that the retaining surface engages with the bottom surface of the printed circuit board, one or more stop pins may be slid 330 from an unengaged position to an engaged position such that the engaged position limits the rotation of the hub and prevents removal of the post through the mounting hole. The stop pins can engage with and edge of the printed circuit board.

Figure 4:
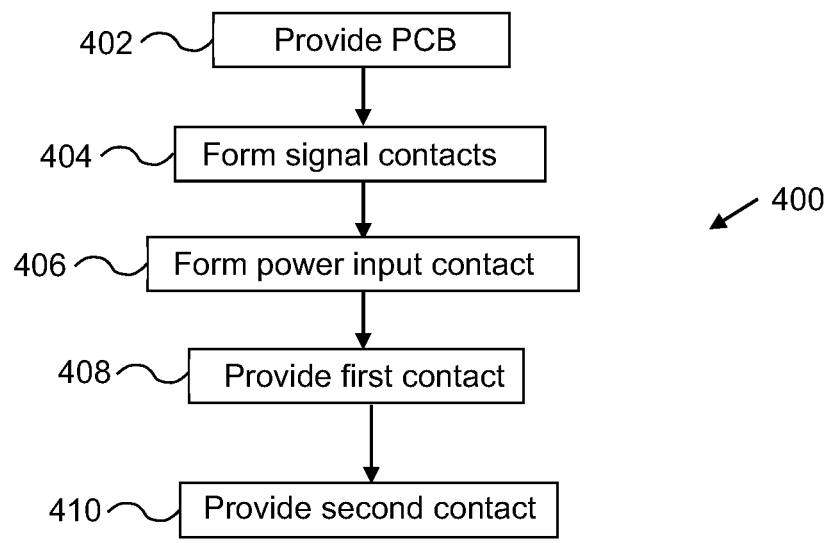
FIG. 4 is a flow chart showing a method of manufacturing a switch.

In another embodiment, a method indicated generally at 400 of FIG. 4, of manufacturing a switch comprises providing 402 a printed circuit board having a top surface and a non-contact area on the top surface. At least one signal contact is formed 404 as part of the top surface of the printed circuit board along a path of travel over the top surface, and a power input contact is also formed 406 as part of the top surface of the printed circuit board to be along the path of travel. The method further includes providing 408 a first contact that is operable to make a first electrical connection with the one or more signal contacts and providing 410 a second contact that is operable to make a second electrical connection with the power input contact.

The power input contact is offset from the signal contact along the path of travel such that upon simultaneously moving the first and second contacts along the path of travel from a noncontact area of the top surface toward the one or more signal contacts, the second contact makes the second electrical connection with the power input contact before the first contact makes the first electrical connection with the one or more signal contacts. As described above, the first electrical connection is part of a first circuit that includes the contact piece, the first contact, and the signal contact. The second electrical connection is part of a second circuit that includes the power input contact, the contact piece, and the second contact.

While illustrated embodiments of the present invention have been described and illustrated in the appended drawings, the present invention is not limited thereto but only by the scope of the appended claims.

I claim:

1. A switch, comprising:
    a contact piece having
        a first arm having a first contact;
        a second arm having a second contact;
        wherein the first arm is integrally formed with the second arm;
    a positioner;
    a printed circuit board having
        a top surface;
        a power input contact formed as part of the top surface;
        a plurality of signal contacts disposed at a plurality of predetermined positions as part of the top surface;
        a plurality of detents integrally formed into the top surface of the printed circuit board, at least one detent operable with the positioner to station the first contact of the first arm on a signal contact;
        wherein the first contact of the contact piece is operable to make an electrical connection with one of the plurality of signal contacts and the second contact is operable to make an electrical connection with the power input contact.

2. The switch of claim 1, wherein the contact piece further comprises a third arm integrally formed with the first and second arms, the positioner being disposed on the third arm.

3. The switch of claim 1, wherein the positioner is a ball bearing.

4. The switch of claim 1, further comprising a hub having an engagement surface for engaging the contact piece and operable to move the first contact of the first arm between the plurality of positions.

5. The switch of claim 1, wherein the detents and signal contacts are disposed in an arcuate pattern.

6. The switch of claim 4, wherein
    the printed circuit board further comprises a mounting hole through the printed circuit board and a power output contact formed into the top surface and disposed around at least a portion of the mounting hole;
    the hub further comprises a mounting post, the mounting post being insertable into the mounting hole such that the hub is rotatable around an axis formed by the mounting post; and
    the contact piece further comprises at least a third contact disposed to engage the power output contact.

7. The switch of claim 6, wherein the mounting hole is oblong and the mounting post further comprises an outer surface, an oblong bottom end, and at least one protrusion extending radially outwardly from the outer surface of the mounting post to form a portion of the oblong bottom end, the at least one protrusion having a retainer surface to engage a bottom surface of the printed circuit board.

8. The switch of claim 6, wherein the hub defines a stop pin hole disposed through the hub and the switch further comprises a stop pin disposed in the stop pin hole, the stop pin being slideable within the stop pin hole to engage a portion of the printed circuit board and prevent over-rotation of the hub.

9. The switch of claim 1, wherein a detent is operable in coordination with the positioner to station the first contact of the first arm on a noncontact area of the printed circuit board.

10. The switch of claim 9, wherein the power input contact is disposed on the printed circuit board such that, upon movement of the first contact from the noncontact area to a signal contact, the second contact will align with the power input contact prior to the first contact aligning with the signal contact.

11. The switch of claim 9, wherein the power input contact is electrically inactive when the first contact of the first arm is aligned with the noncontact area of the printed circuit board.

12. A method of assembling a selector switch comprising
providing a printed circuit board having a bottom surface, a top surface, and a mounting hole extending through the printed circuit board;
providing a contact piece having post hole formed therein, a first arm having a first contact, and a second arm having a second contact, the first arm being integrally formed with the second arm;
providing a hub having at least one engaging surface for engaging with the contact piece and a mounting post having an outer surface, an oblong bottom end, and at least one protrusion extending radially outwardly from the outer surface of the mounting post, the at least one protrusion having a retainer surface for engaging with the bottom surface of the printed circuit board;
orienting the contact piece relative to the hub such that the at least one engaging surface of the hub will engage the contact piece when the switch is assembled;
inserting the oblong bottom end of the mounting post through the post hole of the contact piece;
orienting the printed circuit board such that the oblong bottom end will pass through the mounting hole;
inserting the oblong bottom end of the mounting post through the mounting hole; and
rotating the hub and contact piece such that the retainer surface of the at least one protrusion engages with the bottom surface of the printed circuit board.

13. The method of claim 12, further comprising:
forming a plurality of detents into the top surface of the printed circuit board; and
providing a positioner operable with the plurality of detents;
wherein the positioner and the detents cooperate to station the first contact at a first plurality of predetermined positions on the top surface of the printed circuit board.

14. The method of claim 13, further comprising forming a plurality of signal contacts as part of the top surface of the printed circuit board at the first plurality of predetermined positions.

15. The method of claim 13, wherein the positioner and the detents cooperate to station the second contact at a second plurality of predetermined positions on the top surface of the printed circuit board.

16. The method of claim 12, further comprising:
forming the mounting hole in the printed circuit board;
forming a power input contact as part of the top surface of the printed circuit board; and
forming a power output contact as part of the top surface to be around at least a portion of the mounting hole.

17. The method of assembling a selector switch of claim 12, further comprising sliding a stop pin disposed in a hole in the hub from an unengaged position to an engaged position, such that the engaged position limits the rotation of the hub and contact piece and prevents removal of the mounting post through the mounting hole.

18. A switch comprising:
a contact piece having
a first contact;
a second contact;
a printed circuit board having
a top surface;
a power input contact formed into the top surface;
a power output contact formed into the top surface;
a noncontact area of the top surface; and
a plurality of signal contacts disposed at a plurality of predetermined positions as part of the top surface;
wherein the power input contact and the plurality of signal contacts are disposed on the top surface of the printed circuit board such that, upon movement of the first contact from the noncontact area to a signal contact, the second contact will align with the power input contact prior to the first contact aligning with the signal contact.

19. The switch of claim 18, further comprising
a positioner; and
at least one detent formed into the top surface of the printed circuit board, the at least one detent operable in coordination with the positioner to station the first contact on a signal contact.

20. The switch of claim 18, wherein the power output contact is disposed around a mounting hole.

21. A method of manufacturing a switch comprising:
providing a printed circuit board having a top surface, the top surface having a noncontact area;
forming at least one signal contact as part of the top surface of the printed circuit board along a path of travel over the top surface;
forming a power input contact as part of the top surface of the printed circuit board along the path of travel;
providing a first contact operable to make a first electrical connection with the at least one signal contact;
providing a second contact operable to make a second electrical connection with the power input contact;
wherein the power input contact is offset from the signal contact along the path of travel such that, upon simultaneously moving the first and second contacts along the path of travel from the noncontact area toward the at least one signal contact, the second contact makes the second electrical connection with the power input contact before the first contact makes the first electrical connection with the at least one signal contact.

22. The method of claim 21, wherein the first electrical connection is part of a first circuit, the first circuit including the contact piece, the first contact, and the signal contact.

23. The method of claim 21, wherein the second electrical connection is part of a second circuit, the second circuit including the power input contact, the contact piece, and the second contact.

24. The method of claim 21, wherein the path of travel is an arc.

25. A rotary switch, comprising:
a contact piece integrally formed from a conductive material and having a pivot point, the integrally formed contact piece comprising:
a first arm including a first contact;
a second arm including a second contact, the second contact being electrically connected to the first contact; and a third arm having a first portion of the positioning mechanism; and a printed circuit board comprising:

a top surface;

a power input contact formed into the top surface;

a noncontact area disposed on the top surface;

electrically isolated signal contacts formed into the top surface; and a second portion of the positioning mechanism, the second portion being defined by the top surface and being mateable with the first portion;

wherein:

the integrally formed contact piece is rotatable about the pivot point to be parallel to the printed circuit board between a first position and a second position;

the integrally formed contact piece biases the first contact and the second contact to the top surface of the printed circuit board;

when the integrally formed contact piece is in the first position, the first and second portions of the positioning mechanism are disposed to maintain the integrally formed contact piece in the first position, such that the second contact is electrically isolated from the power input contact and the first contact is electrically isolated from the signal contacts; and when the integrally formed contact piece is in the second position, the first and second portions of the positioning mechanism are disposed to maintain the integrally formed contact piece in the second position, such that the second contact is electrically connected to the power input contact and the first contact is electrically connected to a signal contact.

26. The rotary switch of claim 25, wherein the first portion of the positioning mechanism is a ball cooperating with the third arm and the second portion of the positioning mechanism comprises a plurality of detents recessed into the top surface of the printed circuit board.

* * * * *